(12) United States Patent
Atsumi

(10) Patent No.: US 8,754,511 B2
(45) Date of Patent: Jun. 17, 2014

(54) HEAT SINK FOR ELECTRICAL POWER CONVERTER

(75) Inventor: Takashi Atsumi, Okazaki (JP)

(73) Assignee: Toyota Jidosha Kabushiki Kaisha, Toyota-shi, Aichi-ken (JP)

( * ) Notice: Subject to any disclaimer, the term of this patent is extended or adjusted under 35 U.S.C. 154(b) by 0 days.

(21) Appl. No.: 13/542,839

(22) Filed: Jul. 6, 2012

(65) Prior Publication Data

US 2013/0113090 A1 May 9, 2013

Related U.S. Application Data

(63) Continuation of application No. PCT/JP2011/075471, filed on Nov. 4, 2011.

(51) Int. Cl.
*H01L 23/495* (2006.01)
*H05K 5/02* (2006.01)
*H01L 21/00* (2006.01)
*H01L 23/64* (2006.01)
*H01L 23/433* (2006.01)

(52) U.S. Cl.
CPC .... *H01L 23/49537* (2013.01); *H01L 23/49568* (2013.01); *H01L 23/49575* (2013.01); *H01L 23/647* (2013.01); *H01L 23/4334* (2013.01)
USPC .... 257/675; 257/693; 257/787; 257/E23.051; 361/813; 438/123

(58) Field of Classification Search
CPC .............. H01L 23/49537; H01L 23/49568; H01L 23/49575; H01L 23/647; H01L 23/4334
USPC ......... 257/577, 672, 675, 676, 690, 692–695, 257/787; 361/813; 438/123
See application file for complete search history.

(56) References Cited

U.S. PATENT DOCUMENTS 4,599,676 A 7/1986 Rice et al.
7,846,779 B2 * 12/2010 Yang ............................. 438/123
(Continued)

FOREIGN PATENT DOCUMENTS

JP 5-217801 8/1993
JP 7-44125 5/1995
(Continued)

OTHER PUBLICATIONS

International Search Report in International Application No. PCT/JP2011/075471; Mailing Date: Feb. 14, 2012.
Written Opinion of the International Searching Authority in International Application No. PCT/JP2011/075471; Mailing Date: Feb. 14, 2012.

*Primary Examiner* — Alonzo Chambliss
(74) *Attorney, Agent, or Firm* — Finnegan, Henderson, Farabow, Garrett & Dunner, LLP

(57) ABSTRACT

In order to prevent an increase in temperature of a discharge resistance discharging an electric charge accumulated in a smoothing capacitor, the present description discloses a power module. The power module has a first lead frame, a second lead frame, first and second semiconductor switches connected in series between the first lead frame and the second lead frame, a resistor connected between the first lead frame and the second lead frame, and a resin package that encapsulates the first lead frame, the second lead frame, the first semiconductor switch, the second semiconductor switch, and the resistor. In this power module, a radiator portion for radiating heat from the first lead frame and/or the second lead frame is formed in at least a part of the package.

8 Claims, 8 Drawing Sheets

(56) References Cited

U.S. PATENT DOCUMENTS

| | | |
|---|---|---|
| 2001/0033477 A1 | 10/2001 | Inoue et al. |
| 2003/0090873 A1 | 5/2003 | Ohkouchi |
| 2004/0144996 A1 | 7/2004 | Inoue |
| 2005/0040515 A1 | 2/2005 | Inoue et al. |
| 2006/0120047 A1 | 6/2006 | Inoue |
| 2006/0232939 A1 | 10/2006 | Inoue |
| 2009/0218665 A1* | 9/2009 | Yang ............................. 257/676 |
| 2009/0218666 A1* | 9/2009 | Yang ............................. 257/677 |
| 2010/0074552 A1* | 3/2010 | Sun et al. ...................... 382/264 |
| 2011/0249421 A1 | 10/2011 | Matsuo et al. |
| 2012/0001308 A1* | 1/2012 | Fukutani et al. ............. 257/675 |
| 2012/0175757 A1* | 7/2012 | Katsuki ......................... 257/676 |
| 2013/0147016 A1* | 6/2013 | Hauenstein ................... 257/536 |

FOREIGN PATENT DOCUMENTS

| | | |
|---|---|---|
| JP | 2001-308263 | 11/2001 |
| JP | 2003-333859 | 11/2003 |
| JP | 2008-211129 | 9/2008 |
| JP | 2009-189175 | 8/2009 |
| JP | 2009-261196 | 11/2009 |
| JP | 2009-278794 | 11/2009 |
| JP | 2011-151995 | 8/2011 |
| JP | 2011-217546 | 10/2011 |
| WO | WO 86/05029 | 8/1986 |
| WO | WO 2010/050428 A1 | 5/2010 |

* cited by examiner

HEAT SINK FOR ELECTRICAL POWER CONVERTER

CROSS-REFERENCE TO RELATED APPLICATION

This is a Continuation of International Application No. PCT/JP2011/075471 filed on Nov. 4, 2011, the disclosure of which is hereby incorporated by reference herein in its entirety.

TECHNICAL FIELD

The present invention relates to a power module, an electrical power converter, and an electric vehicle.

BACKGROUND ART

An electrical power converter of an electric vehicle is provided with a smoothing capacitor for smoothing an input/output voltage. In the electrical power converter provided with the smoothing capacitor, an electric charge that is accumulated in the smoothing capacitor needs to be discharged when an electrical system of the electric vehicle is stopped. A discharge resistance is often provided in the electrical power converter as one of the methods for discharging the electric charge. During a normal operation of the electrical system of the electric vehicle having the electrical power converter provided with the discharge resistance, a small amount of current flows in the discharge resistance, and consequently the discharge resistance generates heat. Heating the smoothing capacitor by the heat of the discharge resistance deteriorates the properties of the smoothing capacitor. Therefore, there has conventionally been developed a technology for protecting the smoothing capacitor from the heat of the discharge resistance.

Japanese Patent Application Publication No. 2008-211129 discloses a structure of an electrical power converter provided with a smoothing capacitor and a discharge resistance, wherein the smoothing capacitor is not easily heated by the heat generated by the discharge resistance.

SUMMARY OF INVENTION

In the prior art, although the smoothing capacitor is heat-resistant, the discharge resistance itself generates heat and becomes hot. For this reason, a highly heat-resistant resistor such as a cement resistance needs to be used as the discharge resistance, which results in a production cost increase. A resistor that is less heat-resistant than the conventional resistor can be used as long as an increase in temperature of the discharge resistance can be prevented, in order to reduce the production costs.

The present description discloses a power module. The power module has a first lead frame, a second lead frame, first and second semiconductor switches connected in series between the first lead frame and the second lead frame, a resistor connected between the first lead frame and the second lead frame, and a resin package that encapsulates the first lead frame, the second lead frame, the first semiconductor switch, the second semiconductor switch, and the resistor. In this power module, a radiator portion for radiating heat from the first lead frame and/or the second lead frame is formed in at least a part of the package.

The "lead frames" described herein mean electrically and thermally conductive members, which are capable of supplying electrical power to the first semiconductor switch and/or the second semiconductor switch and transferring heat from the first semiconductor switch and/or the second semiconductor switch. The lead frames are typically elongated metal plates. The "semiconductor switches" described herein mean semiconductor devices that are capable of switching between an electrical conduction state and an electrical non-conduction state of a circuit in accordance with the operations of a switching element such as an IGBT. Part of the lead frames are encapsulated in the package and the other part thereof are exposed from the package.

The power module described above has a pair of the first and second semiconductor switches, which is used in, for example, a booster circuit, a three-phase inverter circuit, and the like. In this power module, heat generated by the first semiconductor switch and the second semiconductor switch is radiated from the radiator portion to the outside through the first lead frame and/or the second lead frame. In this power module, the first semiconductor switch and the second semiconductor switch heated by a switching operation can be cooled by radiating the heat through the radiator portion.

When using this power module as a component of the booster circuit or the three-phase inverter circuit that is used along with the smoothing capacitor, the resistor encapsulated in the package can be caused to function as the discharge resistance of the smoothing capacitor. In this power module, the heat generated in the resistor is radiated to the outside from the radiator portion via the first lead frame and/or the second lead frame. This can prevent an increase in temperature of the resistor functioning as the discharge resistance of the smoothing capacitor. A material having low heat resistance can be used as the discharge resistance, so that the production costs can be reduced.

The power module described above does not require any bolts, wires, cables, terminals, and other parts that are required in the prior art in order to attach the discharge resistance in parallel to the smoothing capacitor. Therefore, the parts-count in the power module described above can be reduced, reducing labor for the attachment works.

DESCRIPTION OF EMBODIMENTS

Figure 1:
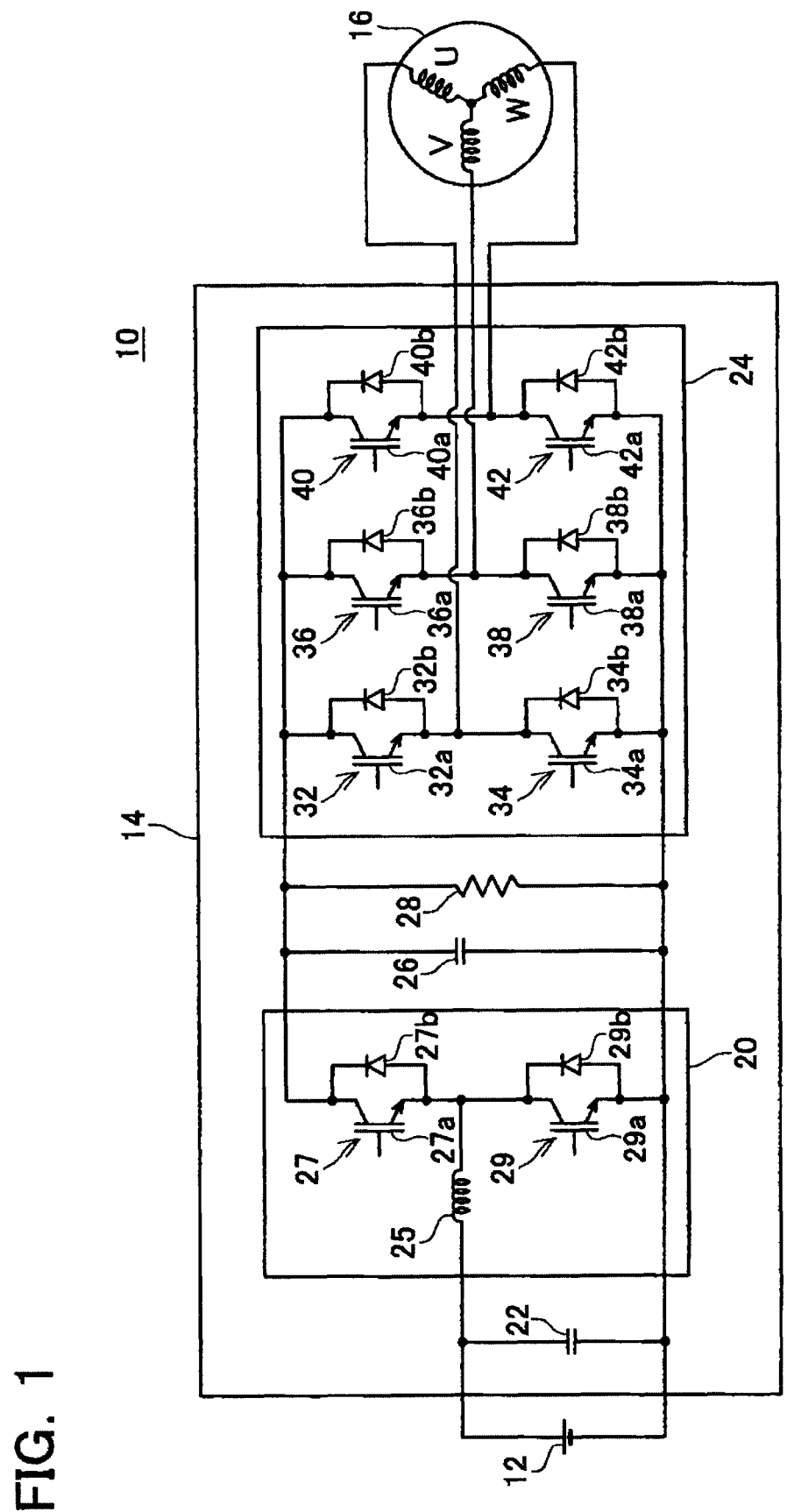
FIG. 1 is a diagram schematically showing an electrical system of an electric vehicle 10 according to first and second embodiments.

In the power module described in the present description, it is preferred that the resistor be a surface-mount resistor and be soldered to the first lead frame and the second lead frame.

In this power module, the resistor can be reflow-soldered to the first lead frame and the second lead frame. The first semiconductor switch and the second semiconductor switch also are normally reflow-soldered to the first lead frame and the second lead frame. According to this power module, attaching the first and second semiconductor switches and attaching the resistor can be performed in the same reflow-soldering step. Therefore, jigs that are required in the attachment works can be simplified, reducing labor for the attachment works.

In this power module, it is preferred that grooves be formed on the first lead frame and the second lead frame in order to attach the resistor thereto.

According to the power module, an increase in size thereof by attaching the resistor can be prevented. The size of the power module can be reduced.

In the power module described in the present description, it is preferred that the package be formed into a flat rectangular cuboid, and that the radiator portion be formed on either side surface of the package.

This power module can be cooled from either side surface, increasing the cooling efficiency.

It is preferred that the power module described above further have a third lead frame connected between the first semiconductor switch and the second semiconductor switch, that the third lead frame be also encapsulated in the package, that outer surfaces of the first and second lead frames be exposed on one of the side surface of the power module, that an outer surface of the third lead frame be exposed on the other side surface of the power module, that one end of the resistor be connected to an inner surface of the first lead frame, and that the other end of the resistor be connected to an inner surface of the second lead frame.

This power module can realize a structure capable of cooling the power module through the side surfaces thereof, without increasing the size thereof.

Alternatively, it is preferred that this power module further have the third lead frame and a fourth lead frame that are connected in series between the first semiconductor switch and the second semiconductor switch, and a conductive bridge connected between the third lead frame and the fourth lead frame, wherein the third lead frame, the fourth lead frame, and the conductive bridge are also encapsulated in the package, outer surfaces of the first and fourth lead frames are exposed on one of the side surfaces of the power module, outer surfaces of the second and third lead frames are exposed on the other side surface of the power module, one end of the resistor is connected to the inner surface of the first lead frame, the other end of the resistor is connected to the inner surface of the second lead frame, one end of the conductive bridge is connected to an inner surface of the third lead frame, and the other end of the conductive bridge is connected to an inner surface of the fourth lead frame.

This power module can realize a structure capable of cooling the power module through the side surfaces thereof, without increasing the size thereof.

The present description also discloses an electrical power converter. This electrical power converter has the power module described above and a smoothing capacitor.

The present description also discloses an electric vehicle. This electric vehicle has the abovementioned electrical power converter and a motor.

The details of the technology disclosed in the present description are described with the following embodiments of the present invention.

(First Embodiment)

FIG. 1 shows an electrical system of an electric vehicle 10. The electric vehicle 10 has a battery 12, electrical power converter 14, and motor 16. The electric vehicle 10 supplies electrical power stored in the battery 12 to the motor 16 via the electrical power converter 14, to rotate a drive shaft of wheels. If the battery 12 is a secondary battery, the electrical power regenerated by the motor 16 during deceleration of the electric vehicle 10 can be supplied to the battery 12 via the electrical power converter 14 to charge the battery 12. The electric vehicle 10 may be a battery-powered electric vehicle or a hybrid vehicle. The battery 12 may be a secondary battery such as a lithium-ion battery or a primary battery such as a fuel cell. The motor 16 is a three-phase AC motor that rotates the drive shaft of the wheels.

The electrical power converter 14 has a booster circuit 20, first smoothing capacitor 22, three-phase inverter circuit 24, second smoothing capacitor 26, and discharge resistance 28.

The booster circuit 20 is a DC/DC converter, which boosts a voltage supplied from the battery 12 to a voltage appropriate for driving the motor 16. In this embodiment, a voltage of 300 V is supplied from the battery 12, and the voltage appropriate for driving the motor 16 is 600 V. The booster circuit 20 can also reduce a voltage of electrical power regenerated by the motor 16 during deceleration of the electric vehicle 10, to the same voltage as that of the battery 12. The booster circuit 20 has a reactor 25, upper arm switch 27, and lower arm switch 29. The upper arm switch 27 has an IGBT 27a, which is a switching element, and a free wheel diode 27b. The IGBT 27a and free wheel diode 27b configuring the upper arm switch 27 are formed adjacent to each other on a single semiconductor chip. The lower arm switch 29 has an IGBT 29a, which is a switching element, and a free wheel diode 29b. The IGBT 29a and free wheel diode 29b configuring the lower arm switch 29 are formed adjacent to each other on a single semiconductor chip.

The first smoothing capacitor 22 is provided between the battery 12 and the booster circuit 20 and smoothes input/output voltage between the battery 12 and the booster circuit 20. Providing this first smoothing capacitor 22 can curb the impact of a switching operation of the booster circuit 20 on the battery 12.

The three-phase inverter circuit 24 converts DC power supplied from the booster circuit 20 into three-phase AC power used for driving the motor 16. The three-phase inverter circuit 24 can also convert three-phase AC power regenerated by the motor 16 during deceleration of the electric vehicle 10, into DC power to be supplied to the booster circuit 20. The three-phase inverter circuit 24 has upper and lower arm switches 32 and 34 for generating a U-phase output, upper and lower arm switches 36 and 38 for generating a V-phase output, and upper and lower arm switches 40 and 42 for generating a W-phase output. The upper arm switch 32 has an IGBT 32a, which is a switching element, and a free wheel diode 32b. The IGBT 32a and free wheel diode 32b configuring the upper arm switch 32 are formed adjacent to each other on a single semiconductor chip 32c (see FIG. 2). The lower arm switch 34 has an IGBT 34a, which is a switching element, and a free wheel diode 34b. The IGBT 34a and free wheel diode 34b configuring the lower arm switch 34 are formed adjacent to each other on a single semiconductor chip 34c (see FIG. 2). The upper arm switch 36 has an IGBT 36a, which is a switching element, and a free wheel diode 36b. The IGBT 36a and free wheel diode 36b configuring the upper arm switch 36 are formed adjacent to each other on a single semiconductor chip 36c (see FIG. 2). The lower arm switch 38 has an IGBT 38a, which is a switching element, and a free wheel diode 38b. The IGBT 38a and free wheel diode 38b configuring the lower arm switch 38 are formed adjacent to each other on a single semiconductor chip 38c (see FIG. 2). The upper arm switch 40 has an IGBT 40a, which is a switching element, and a free wheel diode 40b. The IGBT 40a and free wheel diode 40b configuring the upper arm switch 40 are formed adjacent to each other on a single semiconductor chip 40c (see FIG. 2). The lower arm switch 42 has an IGBT 42a, which is a switching element, and a free wheel diode 42b. The IGBT 42a and free wheel diode 42b configuring the lower arm switch 42 are formed adjacent to each other on a single semiconductor chip 42c (see FIG. 2).

The second smoothing capacitor 26 is provided between the booster circuit 20 and the three-phase inverter circuit 24 and smoothes input/output voltage between the booster circuit 20 and the three-phase inverter circuit 24. Providing this second smoothing capacitor 26 can curb the impact of the switching operation of the booster circuit 20 on the three-phase inverter circuit 24 and the impact of a switching operation of the three-phase inverter circuit 24 on the booster circuit 20.

The discharge resistance 28 is connected in parallel with the second smoothing capacitor 26. The discharge resistance 28 is provided in order to discharge an electric charge accumulated in the second smoothing capacitor 26 when the electrical system of the electric vehicle 10 is stopped and then consequently the booster circuit 20 and three-phase inverter circuit 24 stop operating. In the electric vehicle 10 of the present embodiment, the resistance value of the discharge resistance 28 is 50 kΩ to 500 kΩ. A small amount of current flows to the discharge resistance 28 during normal operations of the electrical system of the electric vehicle 10, the booster circuit 20, and the three-phase inverter circuit 24. The discharge resistance 28 generates heat to radiate electric energy as thermal energy to the outside.

Figure 2:
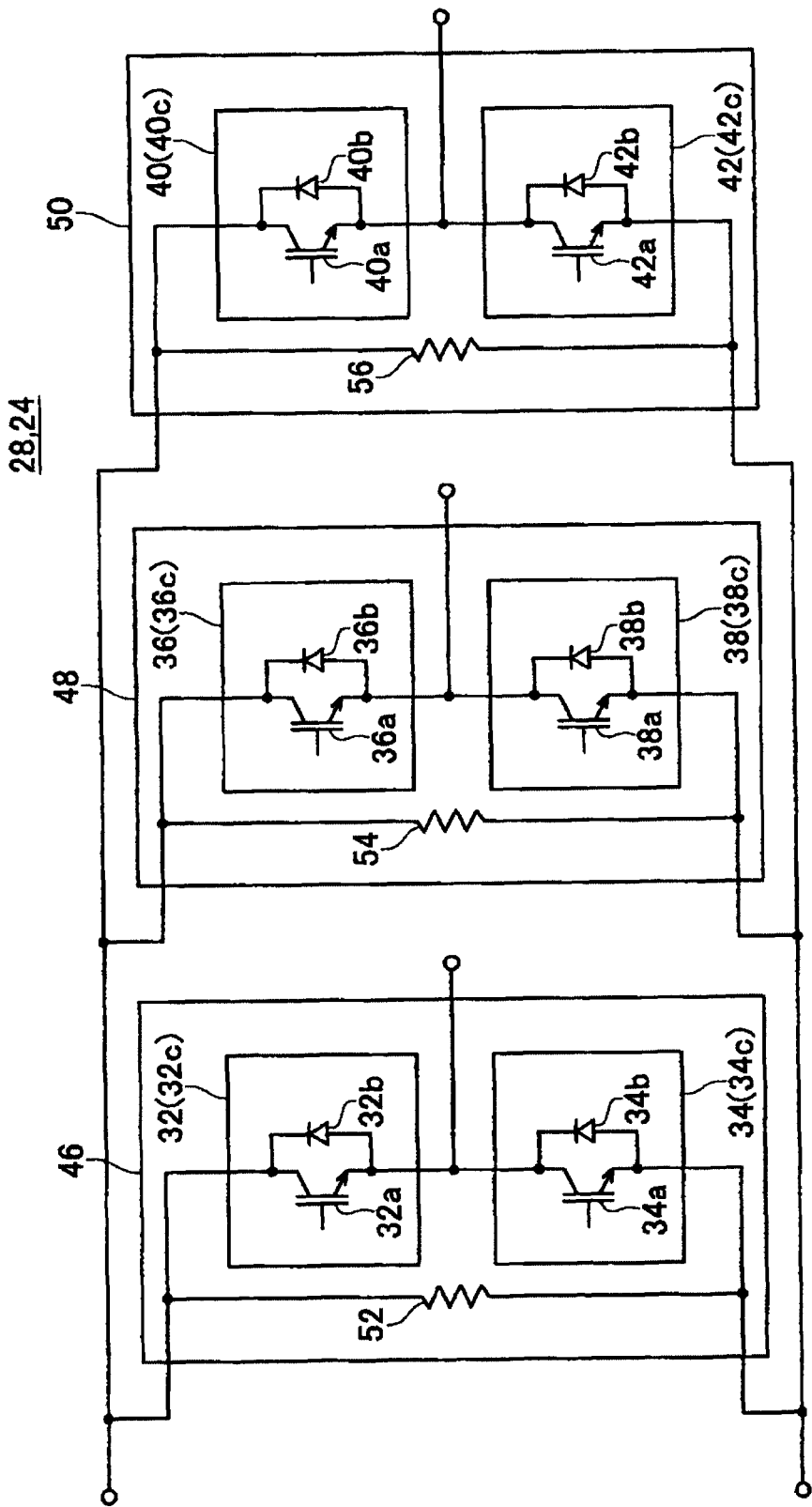
FIG. 2 is a diagram showing circuit configurations of a discharge resistance 28 and three-phase inverter circuit 24 according to the first and second embodiments.

In the electric vehicle 10 of the present embodiment, the first and second smoothing capacitors 22 and 26 of the electrical power converter 14 are stored in the same capacitor case. The upper and lower arm switches 27 and 29 of the booster circuit 20 are stored in a single power card. As shown in FIG. 2, in the three-phase inverter circuit 24, the upper and lower arm switches 32 and 34 that generate the U-phase output are stored in a single power card 46. The upper and lower arm switches 36 and 38 that generate the V-phase output are stored in a single power card 48. The upper and lower arm switches 40 and 42 that generate the W-phase output are stored in a single power card 50. These power cards 46, 48, and 50 are cooled by a cooling mechanism. These power cards are one aspect of the power module.

In the electric vehicle 10 of the present embodiment, the discharge resistance 28 is stored, not in the capacitor case storing the first smoothing capacitor 22 and the second smoothing capacitor 26, but in each of the power cards 46, 48, and 50 of the three-phase inverter circuit 24. As shown in FIG. 2, a resistor 52 connected in parallel with the upper and lower arm switches 32 and 34 is stored in the power card 46. A resistor 54 connected in parallel with the upper and lower arm switches 36 and 38 is stored in the power card 48. A resistor 56 connected in parallel with the upper and lower arm switches 40 and 42 is stored in the power card 50. The discharge resistance 28 is configured by these three resistors 52, 54, and 56.

In the electric vehicle 10 of the present embodiment, the power cards 46, 48, and 50 have the same structure. Hereinafter, the power card 46 is described in detail as an example.

Figure 3:
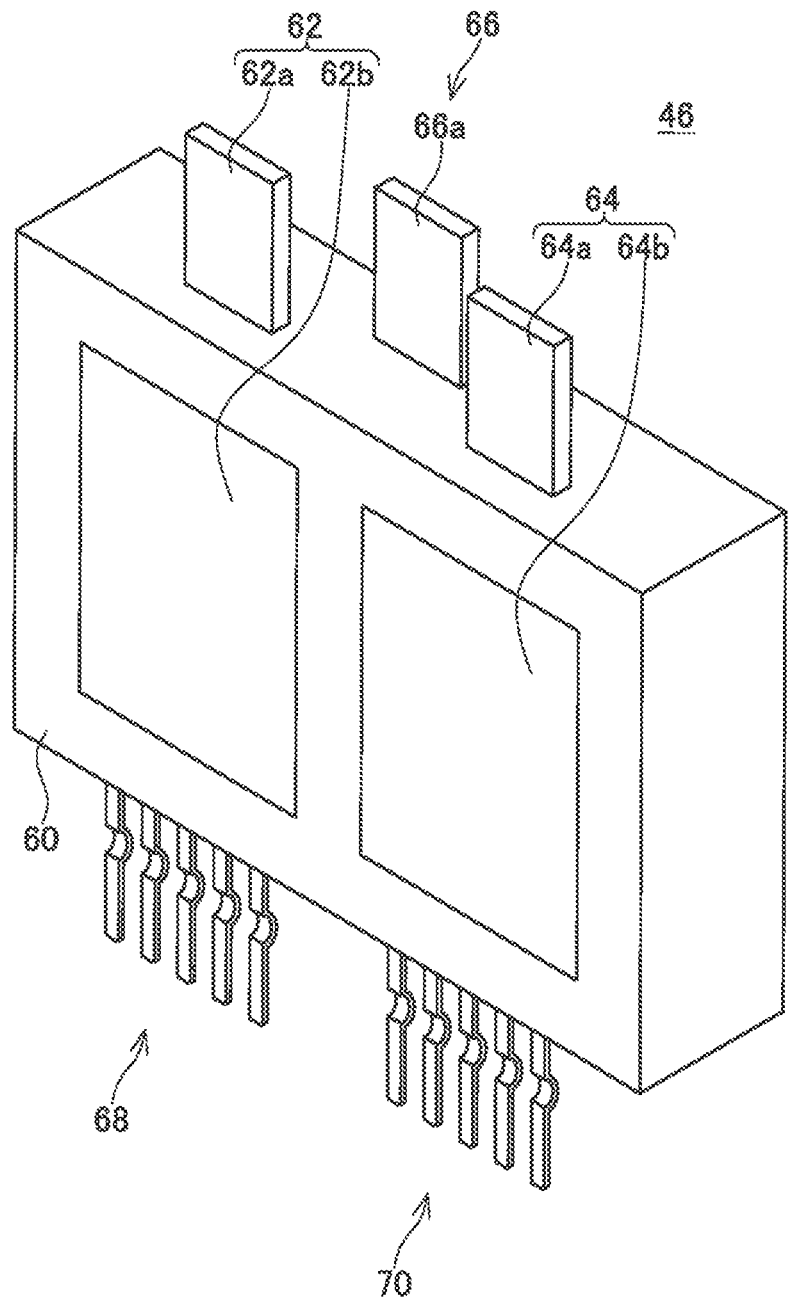
FIG. 3 is a perspective diagram showing an exterior of a power card 46 according to the first embodiment.
Figure 4:
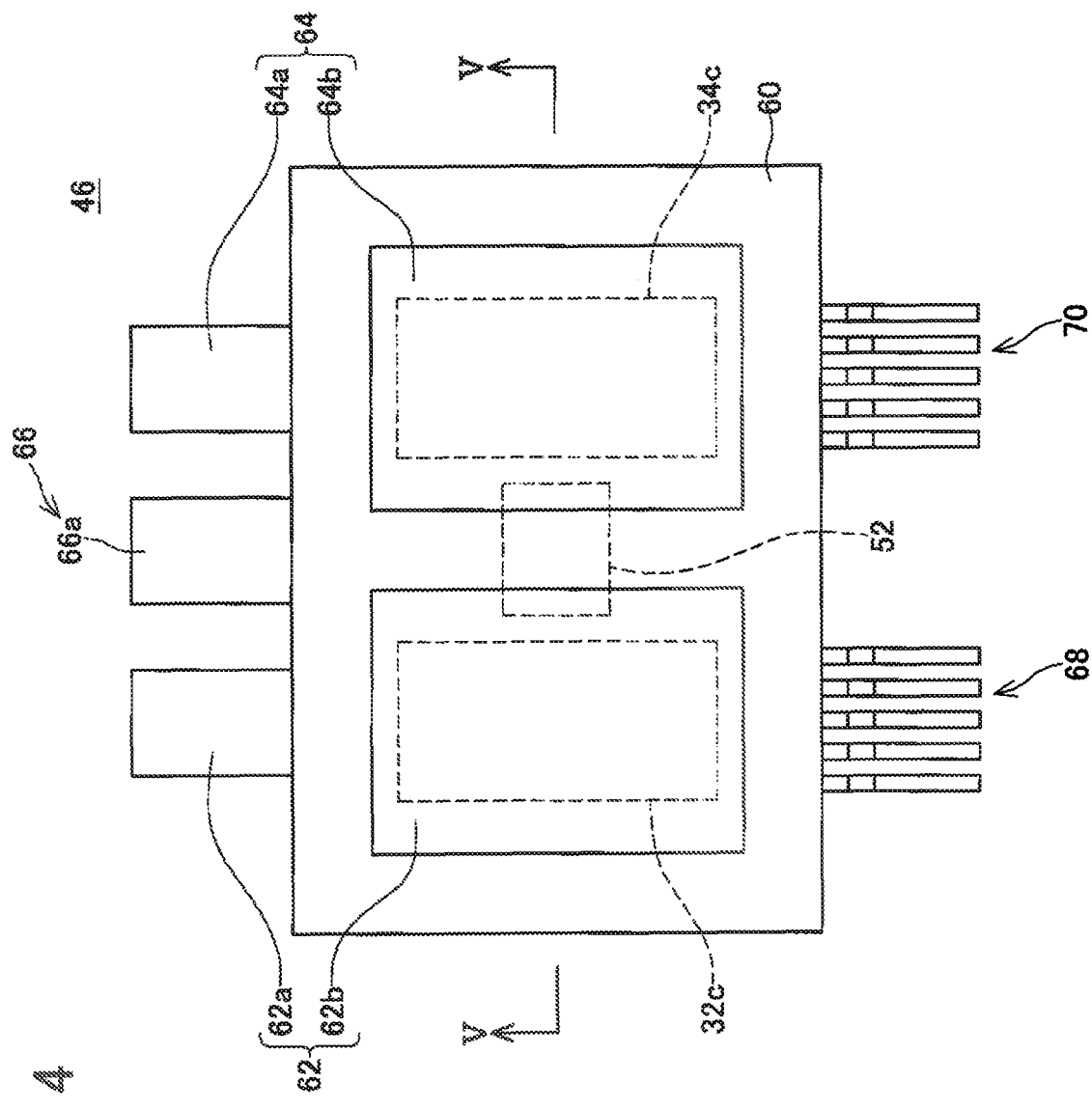
FIG. 4 is a side view of the power card 46 according to the first embodiment.

FIGS. 3 and 4 show exteriors of the power card 46. The power card 46 has a flat rectangular cuboid package 60, first, second, and third electrodes 62; 64; and 66a that project from an upper end surface of the package 60, and first and second control terminals 68 and 70 that project from a lower end surface of the package 60. The package 60 is made of, for example, epoxy molding resin. First and second radiator plates 62b and 64b are exposed on one of side surfaces of the package 60 (the left side surface on the near side in FIG. 3). A third radiator plate 66b is exposed on the other side surface of the package 60 (the right side surface on the far side in FIG. 3). The first electrode 62a and first radiator plate 62b are formed from a piece of metal plate. A first lead frame 62 is configured by the first electrode 62a and the first radiator plate 62b. The second electrode 64a and second radiator plate 64b are formed from a piece of metal plate. A second lead frame 64 is configured by the second electrode 64a and the second radiator plate 64b. The third electrode 66a and third radiator plate 66b are formed from a piece of metal plate. A third lead frame 66 is configured by the third electrode 66a and the third radiator plate 66b. Any material may be used for the first, second, and third lead frames 62, 64, and 66, as long as the material is a highly thermally conductive and heat-resistant conductor, such as copper, aluminum alloy, tungsten, and molybdenum. The first control terminal 68 has a gate terminal, drain terminal, current mirror sense terminal, and two temperature detecting terminals of the semiconductor chip 32c of the upper arm switch 32 encapsulated in the package 60. The second control terminal 70 has a gate terminal, drain terminal current mirror sense terminal, and two temperature detecting terminals of the semiconductor chip 34c of the lower arm switch 34 encapsulated in the package 60. The first electrode 62a is connected to a positive electrode of an output of the booster circuit 20. The second electrode 64a is connected to a negative electrode of the output of the booster circuit 20. The third electrode 66a is connected to a U-phase input of the motor 16.

Figure 5:
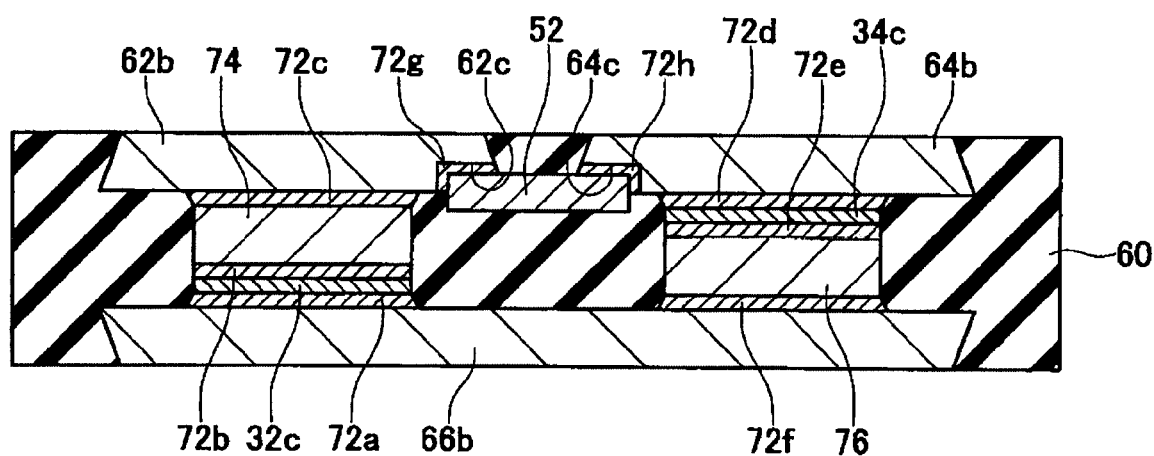
FIG. 5 is a cross-sectional diagram of the power card 46 of the first embodiment, taken along line V-V of FIG. 4.

As shown in FIG. 5, the semiconductor chip 32c in which the upper arm switch 32 is formed is placed between the first radiator plate 62b and the third radiator plate 66b. The semiconductor chip 32c has a cathode electrode on one surface thereof and an anode electrode on the other surface. The surface of the semiconductor chip 32c on which the cathode electrode is formed is joined to the third radiator plate 66b via a solder layer 72a. The surface on which the anode electrode is formed is joined to a conductive spacer 74 via a solder layer 72b. In the present embodiment, the conductive spacer 74 is made from a metallic member. The conductive spacer 74 is joined to the first radiator plate 62b via a solder layer 72c. The semiconductor chip 32c is connected to the first control terminal 68 by means of wire bonding, which is not shown. The conductive spacer 74 can prevent the bonding wire from being short-circuited from the first radiator plate 62b.

The semiconductor chip 34c in which the lower arm switch 34 is formed is placed between the second radiator plate 64b and the third radiator plate 66b. The semiconductor chip 34c has a cathode electrode on one surface thereof and an anode electrode on the other surface. The surface on which the cathode electrode is formed is joined to the second radiator plate 64b via a solder layer 72d. The surface on which the anode electrode is formed is joined to a conductive spacer 76 via a solder layer 72e. In the present embodiment, the conductive spacer 76 is made from a metallic member. The conductive spacer 76 is joined to the third radiator plate 66b via a solder layer 72f. The semiconductor chip 34c is connected to the second control terminal 70 by means of wire bonding, which is not shown. The conductive spacer 76 can prevent the bonding wire from being short-circuited from the third radiator plate 66b.

The resistor 52 connects the first radiator plate 62b and the second radiator plate 64b to each other. In the present embodiment, the resistor 52 is a surface-mount resistor. A groove 62c is formed on an inner surface of the first radiator plate 62b in order to attach the resistor 52 thereto. A groove 64c is formed on an inner surface of the second radiator plate 64b in order to attach the resistor 52 thereto. One end of the resistor 52 is joined to the groove 62c of the first radiator plate 62b via a solder layer 72g. The other end of the resistor 52 is joined to the groove 64c of the second radiator plate 64b via a solder layer 72h.

Outer surfaces of the first and second radiator plates 62b and 64b are exposed on one of side surfaces of the power card 46 (the upper side surface shown in FIG. 5), thereby forming a radiator portion. An outer surface of the third radiator plate 66b is exposed on the other side surface of the power card 46 (the lower side surface shown in FIG. 5), thereby forming a radiator portion. A cooling mechanism can be provided on each of the side surfaces of the power card 46 to cool the power card 46.

When producing the power card 46, first, the bonding wire between the semiconductor chip 32c and the first control terminal 68 and the bonding wire between the semiconductor chip 34c and the second control terminal 70 are connected, and the first, second, and third lead frames 62, 64, and 66, the semiconductor chips 32c and 34c, the conductive spacers 74 and 76, and the resistor 52 are reflow-soldered. Subsequently, the package 60 is molded by a resin molding method such as a transfer molding method. As a result, the first, second, and third lead frames 62, 64, and 66, the semiconductor chips 32c and 34c, the conductive spacers 74 and 76, the resistor 52, the bonding wires, and the first and second control terminals 68 and 70 are encapsulated in the package 60. As shown in the diagram, part of the first, second, and third lead frames 62, 64, and 66, and the first and second control terminals 68 and 70 are embedded in the package 60 and the other part thereof are exposed.

According to the power cards 46, 48, and 50 of the present embodiment, the discharge resistance 28 can be cooled by the cooling mechanism for cooling the upper arm switches 32, 36, and 40 and the lower arm switches 34, 38, and 42 of the three-phase inverter circuit 24. Because the temperature of the discharge resistance 28 can be kept low, a low heat-resistant material can be used for the discharge resistance 28.

According to the power cards 46, 48, and 50 of the present embodiment, the discharge resistance 28 does not have to be provided proximal to the capacitor case in which the first and second smoothing capacitors 22 and 26 of the electrical power converter 14 are stored. Therefore, the first and second smoothing capacitors 22 and 26 can be prevented from being heated by the heat generated by the discharge resistance 28. Moreover, because the discharge resistance 28 does not have to be attached to the capacitor case, bolts, wires, cables, terminals, and other parts for attaching the discharge resistance 28 are not required, reducing the parts count of the electrical power converter 14.

According to the power cards 46, 48, and 50 of the present embodiment, attaching the resistors 52, 54, and 56 and attaching the semiconductor chips 32c and 34c and the conductive spacers 74 and 76 can be performed in the same reflow-soldering step. Therefore, jigs that are required for attaching these components can be simplified, reducing labor for attaching these components.

In the power cards 46, 48, and 50 of the present embodiment, the grooves 62c and 64c are formed on the inner surfaces of the first and second radiator plates 62b and 64b, respectively. Therefore, when attaching the resistors 52, 54 and 56 in the power cards 46, 48, and 50, the power cards 46, 48, and 50 do not become thick. The size of each power card 46, 48, 50 can be reduced.

The embodiment has described a configuration in which the resistors 52, 54, and 56 are attached to the power cards 46, 48, and 50 of the three-phase inverter circuit 24, respectively. However, the resistors may be attached to only one or two of the power cards 46, 48, and 50, and the discharge resistance 28 may be configured by these resistors. Alternatively, the resistors may be attached to the power cards of the booster circuit 20, and the discharge resistance 28 may be configured by these resistors.

The embodiment has described an example in which the discharge resistance 28 and the three-phase inverter circuit 24 are configured by the three power cards 46, 48, and 50; however, the discharge resistance 28 and the three-phase inverter circuit 24 can be realized by a single power card.

The embodiment has described a configuration in which the first, second, and third radiator plates 62b, 64b, and 66b are exposed on the surfaces of the package 60 and form the radiator portion. However, only one or two of the first, second, and third radiator plates 62b, 64b, and 66b may be exposed on the surfaces of the package 60 and form the radiator portion.

(Second Embodiment)

Figure 6:
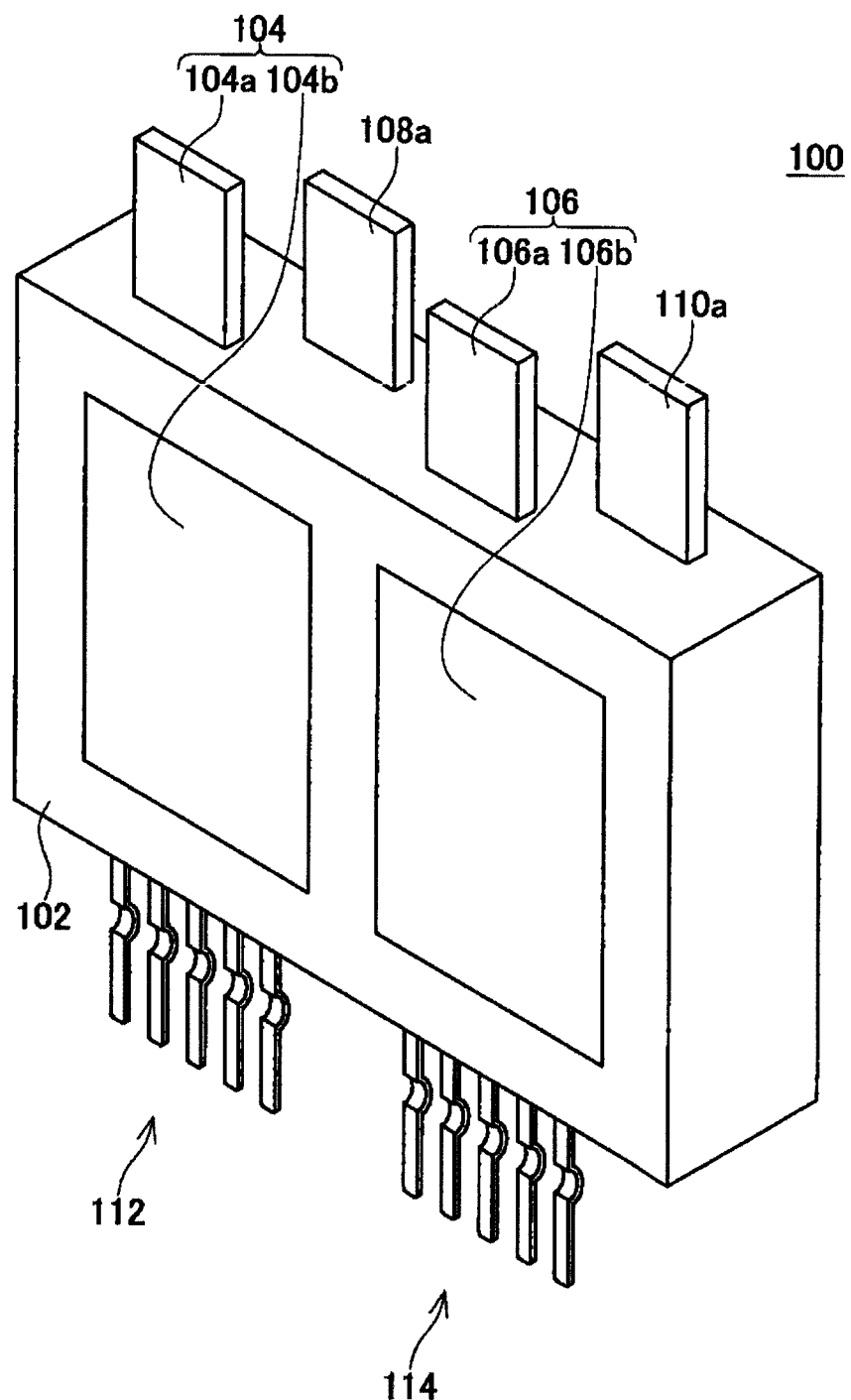
FIG. 6 is a perspective view showing an exterior of a power card 100 according to the second embodiment.
Figure 7:
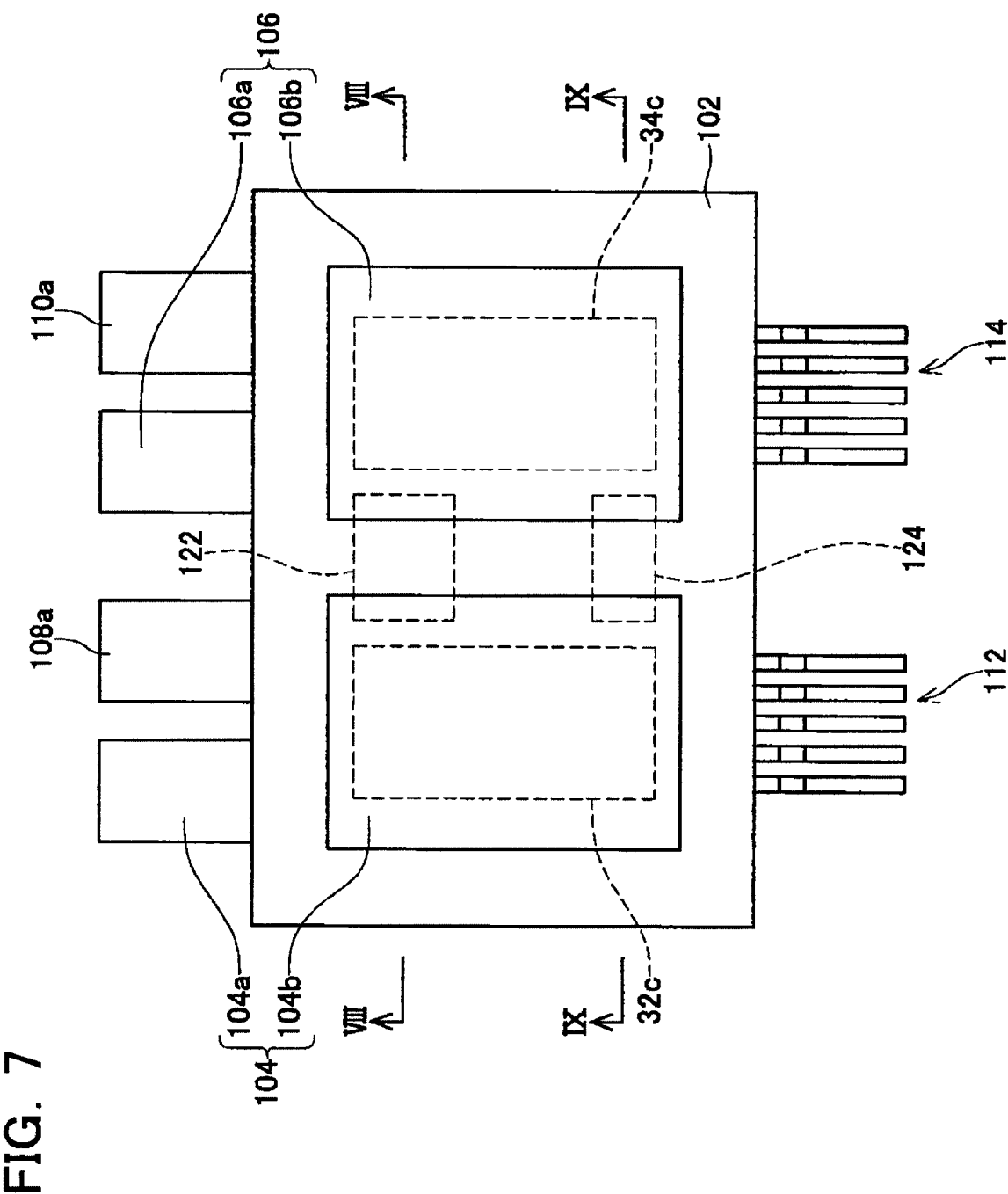
FIG. 7 is a side view of the power card 100 according to the second embodiment.

FIGS. 6 and 7 show exteriors of a power card 100. The power card 100 can be used in replacement of the power card 46 of the first embodiment. The power card 100 has a flat rectangular cuboid package 102, first, second, third, and fourth electrodes 104a, 110a, 108a, and 106a that project from an upper end surface of the package 102, and first and second control terminals 112 and 114 that project from a lower end surface of the package 102. The package 102 is made of, for example, epoxy molding resin. First and fourth radiator plates 104b and 106b are exposed on one of side surfaces of the package 102 (the left side surface on the near side in FIG. 6). Second and third radiator plates 110b and 108b are exposed on the other side surface of the package 102 (the right side surface on the far side in FIG. 6). The first electrode 104a and first radiator plate 104b are formed from a piece of metal plate. A first lead frame 104 is configured by the first electrode 104a and the first radiator plate 104b. The second electrode 110a and second radiator plate 110b are formed from a piece of metal plate. A second lead frame 110 is configured by the second electrode 110a and the second radiator plate 110b. The third electrode 108a and third radiator plate 108b are formed from a piece of metal plate. A third lead frame 108 is configured by the third electrode 108a and the third radiator plate 108b. The fourth electrode 106a and fourth radiator plate 106b are formed from a piece of metal plate. A fourth lead frame 106 is configured by the fourth electrode 106a and the fourth radiator plate 106b. Any material may be used for the first, second, third, and fourth lead frames 104, 110, 108, and 106, as long as the material is a highly thermally conductive and heat-resistant conductor, such as copper, aluminum alloy, tungsten, and molybdenum. The first control terminal 112 has a gate terminal, drain terminal, current mirror sense terminal, and two temperature detecting terminals of the semiconductor chip 32c of the upper arm switch 32 encapsulated in the package 102. The second control terminal 114 has a gate terminal, drain terminal current mirror sense terminal, and two temperature detecting terminals of the semiconductor chip 34c of the lower arm switch 34 encapsulated in the package 102. The first electrode 104a is connected to the positive electrode of the output of the booster circuit 20. The second electrode 110a is connected to the negative electrode of the output of the booster circuit 20.

The third electrode 108a and/or the fourth electrode 106a are connected to the U-phase input of the motor 16.

Figure 8:
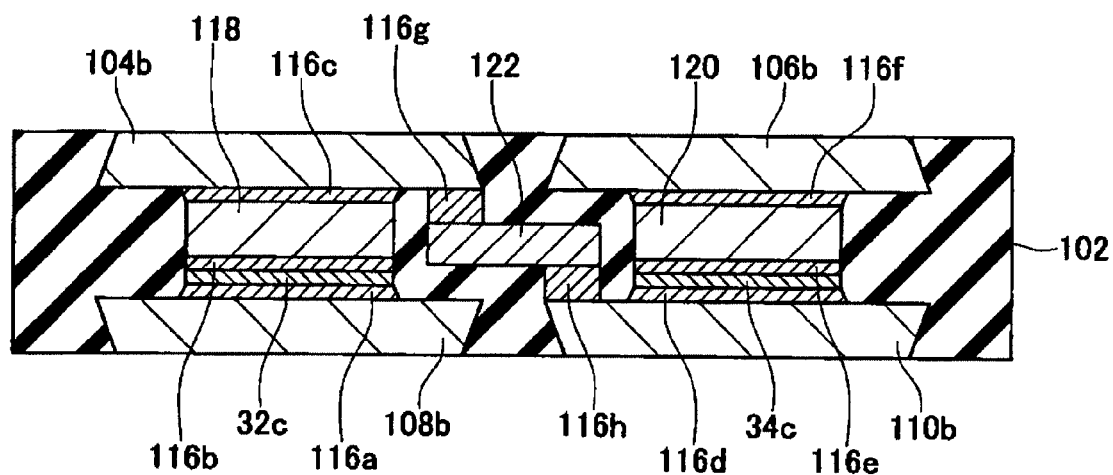
FIG. 8 is a cross-sectional diagram of the power card 100 of the second embodiment, taken along line VIII-VIII of FIG. 7.
Figure 9:
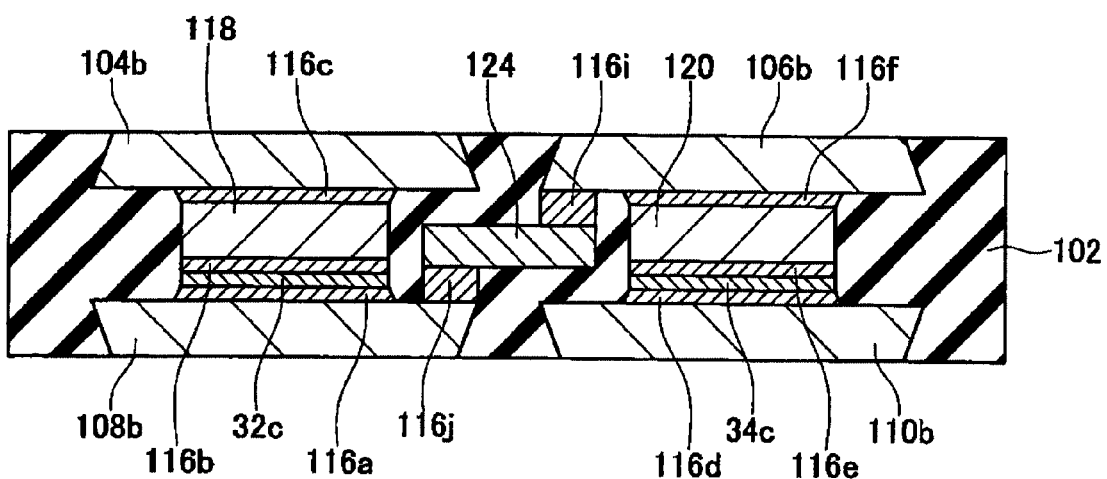
FIG. 9 is a cross-sectional diagram of the power card 100 of the second embodiment, taken along line IX-IX of FIG. 7.

As shown in FIGS. 8 and 9, the semiconductor chip 32c in which the upper arm switch 32 is formed is placed between the first radiator plate 104b and the third radiator plate 108b. The semiconductor chip 32c has a cathode electrode on one surface thereof and an anode electrode on the other surface. The surface of the semiconductor chip 32c on which the cathode electrode is formed is joined to the third radiator plate 108b via a solder layer 116a. The surface on which the anode electrode is formed is joined to a conductive spacer 118 via a solder layer 116b. The conductive spacer 118 is joined to the first radiator plate 104b via a solder layer 116c. The semiconductor chip 32c is connected to the first control terminal 112 by means of wire bonding, which is not shown. The conductive spacer 118 can prevent the bonding wire from being short-circuited from the first radiator plate 104b.

The semiconductor chip 34c in which the lower arm switch 34 is formed is placed between the second radiator plate 110b and the fourth radiator plate 106b. The semiconductor chip 34c has a cathode electrode on one surface thereof and an anode electrode on the other surface. The surface on which the cathode electrode is formed is joined to the second radiator plate 110b via a solder layer 116d. The surface on which the anode electrode is formed is joined to a conductive spacer 120 via a solder layer 116e. The conductive spacer 120 is joined to the fourth radiator plate 106b via a solder layer 116f. The semiconductor chip 34c is connected to the second control terminal 114 by means of wire bonding, which is not shown. The conductive spacer 120 can prevent the bonding wire from being short-circuited from the fourth radiator plate 106b.

As shown in FIG. 8, a resistor 122 connects the first radiator plate 104b and the second radiator plate 110b to each other. In the present embodiment, the resistor 122 is a surface-mount resistor. One end of the resistor 122 is joined to an inner surface of the first radiator plate 104b via a solder layer 116g. The other end of the resistor 122 is joined to an inner surface of the second radiator plate 110b via a solder layer 116h.

As shown in FIG. 9, a conductive bridge 124 connects the third radiator plate 108b and the fourth radiator plate 106b to each other. In the present embodiment, the conductive bridge 124 is made from a metallic member. One of end parts of the conductive bridge 124 is joined to an inner surface of the fourth radiator plate 106b via a solder layer 116i. The other end part of the conductive bridge 124 is joined to an inner surface of the third radiator plate 108b via a solder layer 116j. By disposing the conductive bridge 124, the potentials of the third radiator plate 108b and the fourth radiator plate 106b are kept at the same level.

Outer surfaces of the first and fourth radiator plates 104b and 106b are exposed on one of side surfaces of the power card 100 (the upper side surface shown in FIGS. 8 and 9), thereby forming a radiator portion. Outer surfaces of the second and third radiator plates 106b and 108b are exposed on the other side surface of the power card 100 (the lower side surface shown in FIGS. 8 and 9), thereby forming a radiator portion. A cooling mechanism is provided on each of the side surfaces of the power card 100, thereby enabling the power card 100 to be cooled from both surfaces thereof.

When producing the power card 100, first, the bonding wire between the semiconductor chip 32c and the first control terminal 112 and the bonding wire between the semiconductor chip 34c and the second control terminal 114 are connected, and the first, second, third, and fourth lead frames 104, 110, 108, and 106, the semiconductor chips 32c and 34c, the conductive spacers 118 and 120, the resistor 122, and the conductive bridge 124 are reflow-soldered. Subsequently, the package 102 is molded by a resin molding method such as a transfer molding method. As a result, the first, second, third, and fourth lead frames 104, 110, 108, and 106, the semiconductor chips 32c and 34c, the conductive spacers 118 and 120, the resistor 122, the conductive bridge 124, the bonding wires, and the first and second control terminals 112 and 114 are encapsulated in the package 102. As shown in the diagrams, part of the first, second, third, and fourth lead frames 104, 110, 108, and 106, and the first and second control terminals 112 and 114 are embedded in the package 102 and the other part thereof are exposed.

The power card 100 is so structured that both the third and fourth electrodes 108a and 106a project to the outside of the package 102. However, because the potentials of the third and fourth lead frames 108 and 106 are kept at the same level by the conductive bridge 124, only either one of the third and fourth electrodes 108a and 106a may project to the outside of the package 102.

According to the power card 100 of the present embodiment, attaching the resistor 122 to the conductive bridge 124 and attaching the semiconductor chips 32c and 34c and the conductive spacers 118 and 120 can be performed in the same reflow-soldering step. Therefore, labor for producing the power card 100 can be reduced. Furthermore, jigs that are required for the production can be simplified.

The representative and non-limiting specific embodiments of the present invention are described above in detail with reference to the drawings. The detailed description provided above is simply intended to provide those skilled in the art with the detail for implementing preferred examples of the present invention and is not intended to limit the scope of the present invention. Additional characteristics and inventions disclosed herein can be used independently of, or along with, other characteristics and inventions in order to provide a further improved power module, electrical power converter, and electric vehicle.

The combinations of the characteristics and steps disclosed in the detailed description above are not essential for implementing the present invention in the broadest sense and are merely provided in order to explain particularly the representative specific embodiments of the present invention. In addition, various characteristics of the representative specific embodiments described above and various characteristics described in the independent and dependent claims do not have to be combined in accordance with the embodiments described herein or in any particular order when providing additional and useful embodiments of the present invention.

All the characteristics described in the present description and/or the claims are intended to be disclosed separately and independently from each other for the purpose of original disclosure, as well as for the purpose of restricting the claimed subject matters independent of the compositions of the characteristics described in the embodiments and/or the claims. In addition, all value ranges or indications of groups of entities are intended to disclose every possible intermediate value or intermediate entity for the purpose of original disclosure, as well as for the purpose of restricting the claimed subject matters.

The embodiments of the present invention are described above in detail. However, these embodiments are merely illustrative and are not intended to limit the scope of patent claims. The technology described in the scope of patent claims includes various changes and modifications of the specific embodiments illustrated above. The technical elements exemplified in the present description or the drawings exert technical utility independently or in various combinations, and are not limited to the combinations of the claims described in the application originally filed. Further, the technology exemplified in the present description or the drawings simultaneously achieve a plurality of objects, and achieving one of the objects itself has technical utility.

The invention claimed is:

1. A power module, comprising:
   a first lead frame;
   a second lead frame;
   first and second semiconductor switches connected in series between the first lead frame and the second lead frame;
   a resistor connected between the first lead frame and the second lead frame; and
   a resin package that encapsulates the first lead frame, the second lead frame, the first semiconductor switch, the second semiconductor switch, and the resistor,
   wherein a radiator portion for radiating heat from the first lead frame and/or the second lead frame is formed in at least a part of the package.

2. The power module according to claim 1, wherein the resistor is a surface-mount resistor and is soldered to the first lead frame and the second lead frame.

3. The power module according to claim 2, wherein grooves are formed on the first lead frame and the second lead frame in order to attach the resistor thereto.

4. The power module according to claim 1, wherein the package is formed into a flat rectangular cuboid, and the radiator portion is formed on either side surface of the package.

5. The power module according to claim 4, further comprising:
   a third lead frame connected between the first semiconductor switch and the second semiconductor switch,
   wherein the third lead frame is also encapsulated in the package, outer surfaces of the first and second lead frames are exposed on one of side surfaces of the power module,
   an outer surface of the third lead frame is exposed on the other side surface of the power module,
   one end of the resistor is connected to an inner surface of the first lead frame, and
   the other end of the resistor is connected to an inner surface of the second lead frame.

6. The power module according to claim 4, further comprising:
   third and fourth lead frames connected in series between the first semiconductor switch and the second semiconductor switch; and
   a conductive bridge connected between the third lead frame and the fourth lead frame,
   wherein the third lead frame, the fourth lead frame, and the conductive bridge are also encapsulated in the package,
   outer surfaces of the first and fourth lead frames are exposed on one of side surfaces of the power module,
   outer surfaces of the second and third lead frames are exposed on the other side surface of the power module,
   one end of the resistor is connected to an inner surface of the first lead frame,
   the other end of the resistor is connected to an inner surface of the second lead frame,
   one end of the conductive bridge is connected to an inner surface of the third lead frame, and
   the other end of the conductive bridge is connected to an inner surface of the fourth lead frame.

7. An electrical power converter, comprising:
   the power module described in claim 1; and
   a smoothing capacitor, one end of the smoothing capacitor being connected to the first lead frame, and another end of the smoothing capacitor being connected to the second lead frame.

8. An electric vehicle, comprising:
   the electrical power converter described in claim 7; and
   a motor connected to a connection between the first semiconductor switch and the second semiconductor switch.

* * * * *